US008664946B2

(12) United States Patent
Hesen et al.

(10) Patent No.: US 8,664,946 B2
(45) Date of Patent: Mar. 4, 2014

(54) SENSOR PACKAGES INCLUDING A LEAD FRAME AND MOULDING BODY AND METHODS OF MANUFACTURING

(75) Inventors: Paulus Martinus Catharina Hesen, Hamburg (DE); Roelf Anco Jacob Groenhuis, Nijmegen (NL); Johannes Wilhelmus Dorotheus Bosch, Nijmegen (NL)

(73) Assignee: NXP B.V., Eindhoven (NL)

(*) Notice: Subject to any disclaimer, the term of this patent is extended or adjusted under 35 U.S.C. 154(b) by 1239 days.

(21) Appl. No.: 12/526,833

(22) PCT Filed: Feb. 13, 2008

(86) PCT No.: PCT/IB2008/050510
§ 371 (c)(1),
(2), (4) Date: Aug. 12, 2009

(87) PCT Pub. No.: WO2008/102281
PCT Pub. Date: Aug. 28, 2008

(65) Prior Publication Data
US 2010/0117171 A1    May 13, 2010

(30) Foreign Application Priority Data
Feb. 19, 2007 (EP) .................................... 07003414

(51) Int. Cl.
*G01R 33/09* (2006.01)
(52) U.S. Cl.
USPC .................. 324/207.21; 324/207.25; 324/174

(58) Field of Classification Search
USPC ................................ 324/207.2–207.25, 174
See application file for complete search history.

(56) References Cited

U.S. PATENT DOCUMENTS

| 5,021,736 | A * | 6/1991 | Gonsalves et al. ............ 324/202 |
| 5,121,289 | A * | 6/1992 | Gagliardi ................. 361/679.01 |
| 5,414,355 | A * | 5/1995 | Davidson et al. .......... 324/207.2 |
| 5,500,589 | A * | 3/1996 | Sumcad ........................ 324/202 |
| 5,631,557 | A | 5/1997 | Davidson |
| 6,326,779 | B1 | 12/2001 | Shinjo et al. |
| 7,250,330 | B2 | 7/2007 | Thomas et al. |
| 7,301,329 | B2 * | 11/2007 | Borst et al. ................. 324/207.2 |
| 7,375,406 | B2 * | 5/2008 | Lamb et al. ................... 257/424 |
| 7,385,394 | B2 * | 6/2008 | Auburger et al. ............. 324/252 |
| 2004/0083606 | A1 | 5/2004 | Makita et al. |
| 2004/0227258 | A1 | 11/2004 | Nakatani |
| 2006/0038560 | A1 | 2/2006 | Kurumado |
| 2007/0068491 | A1* | 3/2007 | Kurita et al. ................... 123/399 |
| 2007/0139044 | A1* | 6/2007 | Lamb et al. .................... 324/252 |
| 2011/0179889 | A1* | 7/2011 | De Volder et al. ............ 73/866.5 |

FOREIGN PATENT DOCUMENTS

| CN | 1499594 A | 5/2004 |
| CN | 1508857 A | 6/2004 |
| FR | 2748105 A1 | 10/1997 |
| JP | 2004153113 A | 5/2004 |
| JP | 2004191065 A | 7/2004 |

* cited by examiner

*Primary Examiner* — Jay Patidar

(57) ABSTRACT

In one embodiment, a sensor package includes a lead frame with a first portion extending and a second portion extending in a direction inclined with respect to the first potion. The sensor package also includes an application specific integrated circuit and a magneto resistive sensor and a ferrite provided with a molding body.

6 Claims, 6 Drawing Sheets

SENSOR PACKAGES INCLUDING A LEAD FRAME AND MOULDING BODY AND METHODS OF MANUFACTURING

FIELD OF THE INVENTION

The present invention relates to a sensor package and in particular to a sensor package for automotive applications, i.e. ABS systems, and to a method for manufacturing a sensor package.

BACKGROUND OF THE INVENTION

It is known from the prior art of, for example, U.S. Pat. No. 6,326,779 B1, to provide a magnetic detector having a magnetic resistance element for detecting a magnetic field, a magnet for providing a bias magnetic field to the magnetic resistance element and a protection circuit composed of a plurality of electronic parts. The prior art describes a lead frame for mounting the electronic parts, wherein a base is provided for holding the magnetic resistance element, the magnet and the lead frame, and a case for protecting the base.

Further, U.S. Pat. No. 5,631,557 describes a magnetic sensor a magnetically sensitive element and a permanent magnet as well as electronic components. The entire structure may be moulded with molten thermoset material.

A package comprising a first and a second moulded portion, by which a customer may, if desired, bring the sensor into the required orientation by bending the leads extending between the first and the second moulded portion, has a major disadvantage. After bending, the product is usually over moulded so as to keep the correct orientation of the sensor. Problems occur herein owing to the volume to be moulded is larger on one side of the second portion with the application specific integrated circuit than the second opposite side of this portion. This results from L-shape in cross section of the product after bending. A customer even has to modify the shape of the overmould so as to reduce mould flow problems, however, this may give rise to the phenomenon of die crack and yield loss.

SUMMARY OF THE INVENTION

There may be a need to provide an improved sensor package with which a customer will not have such mould flow problems as described above, and a corresponding manufacturing method.

The invention provides a sensor package, a method for manufacturing a sensor package, a corresponding programme element and a computer readable medium, according to the subject matter of the independent claims. Further embodiments are incorporated in the dependent claims.

It should be noted that the following described exemplary embodiments of the invention apply also for the sensor package, the manufacturing method, the programme product and the computer readable medium.

It should be noted that the single features and steps may also be combined even if the respective combination is not explicitly described.

According to an exemplary embodiment of the invention, a sensor package comprises a lead frame comprising a first portion extending in a direction along a first longitudinal axis and having a die pad, and a second portion extending in the direction inclined to the longitudinal axis, which second portion has a first side facing away from the first portion and a second side opposing to the first side, an application specific integrated circuit, which is mounted on to the die pad, a magneto resistive sensor and a ferrite, which are mounted to the second portion and which magneto resistive sensor is electrically connected to the application specific integrated circuit, and a moulding body covering the second portion of the lead frame, the magneto resistive sensor, the ferrite, the die pad, the application specific integrated circuit and an electrical connection between the magneto resistive sensor and the application specific integrated circuit, wherein the moulding body is formed as a one-piece body in a single moulding step.

With such a sensor package, the orientation of the magneto resistive sensor, the ferrite and the lead frame may be brought into a correct and definite orientation to each other. Thus, due to the moulding body, the orientation may be fixed, so that the handling of the sensor package is much easier. Due to the moulding body as a one-piece body in a single moulding step, the moulding body may be designed as a slim line body, which may be in particular relevant when the sensor package should be installed in a position where the available space is very narrow. On the other hand, the orientation of the ferrite and the magneto resistive sensor cannot be unintentionally changed, so that the function and the characteristic of the sensor package may be maintained, resulting in a reliably working sensor package, which is particularly relevant with respect to safety relevant systems like ABS systems.

According to an exemplary embodiment of the invention, the lead frame is formed as a plurality of fingers in the transit from the first portion to the second portion, wherein at least a part of the fingers are electrically isolated from the die pad.

The provision of fingers allows a much more easy bending of the lead frame in a defined way, and further allows to use the fingers as electrical conductors between, for example, the sensor and the application specific integrated circuit, which is mounted onto the die pad.

According to an exemplary embodiment of the invention, the fingers extend to the mounting area of at least one of the group consisting of the magneto resistive sensor and the ferrite.

Thus, the sensor or the ferrite may be used to fix the fingers with respect to the lead frame, to maintain the fingers position and to maintain the fingers electrically isolated from the die pad. In case the fingers extend from the first portion to the second portion, the bending area falls into the area of the fingers, which reduces the effective widths of the lead frame to be bent. Thus, a die crack or lead frame crack may be avoided, as well as mechanical stresses.

According to an exemplary embodiment of the invention, the inclination of the first portion and the second portion is substantially perpendicular.

This is, in particular, useful when having a position of the sensor package, for example, close to a wheel or rim, where the longitudinal axis of the sensor package extends radially from the wheel or rim. In this case, the positioning of the magneto resistive sensor on the second portion, which is substantially perpendicular to the first portion, allows an optimum position for the magneto resistive sensor.

According to an exemplary embodiment of the invention, the ferrite is directly mounted on to the first side of the second portion of the lead frame, and acts as a substrate for the magneto resistive sensor, which sensor is mounted onto the ferrite. Thus, the position of the ferrite with respect to the position of the magneto resistive sensor is well defined. Further, the ferrite may be used as a stabilising element so that the magneto resistive sensor may be stabilised by the ferrite acting as a substrate.

According to an exemplary embodiment of the invention, the magneto resistive sensor is electrically coupled to the fingers with wire bonds that are attached to the fingers at a side remote from the application specific integrated circuit.

Thus, the fingers may be used as electrical conductors, wherein wire bond connections constitute a kind of electrical connection, which is reliable and easy to handle, and, at the same time, has a low parasitic capacitance and inductance with respect to the input terminals of the magneto resistive sensor.

According to an exemplary embodiment of the invention, the magneto resistive sensor is electrically connected to the application specific integrated circuit by leads on a flexible foil structure.

A flexible foil structure is insensible with respect to mechanical damages, since a flexible foil structure stabilises the leads provided thereon by means of the foil. Further, the connections to the magneto resistive sensor may be pre-assembled so that a pre-assembled component may be supplied for further assembly, which component has an already established reliable connection between the magneto resistive sensor and the leads on the flexible foil structure.

According to an exemplary embodiment of the invention, the magneto resistive sensor and the ferrite are sub-mounted as a separate component, which component is mounted to the second portion.

Thus, the position of the magneto resistive sensor and the ferrite may be exactly set up in order to maintain the desired sensitivity and characteristic of the combination of the magneto resistive sensor and the ferrite, which ferrite increases the sensitivity of the complete sensor package. Further, the final assembly of the sensor package may be designed more effectively when using sub-mounted components, in particular, if the sub-mounting is carried out on elements, which are sensitive with respect to their orientation to each other.

According to a further exemplary embodiment of the invention, the ferrite is mounted onto the second side of the second portion, and the magneto resistive sensor is mounted on to the first side of the second portion.

Thus, the sensor may be mounted independently on the lead frame from the mounting of the ferrite, which may be useful for a fast assembly process, since both components may be mounted simultaneously. Further, with such an arrangement, the magneto resistive sensor may be supported by the lead frame increasing the stability and allowing a shorter distance from the sensor output to the respective fingers, which fingers may be used as electrical conductors.

According to an exemplary embodiment of the invention, the magneto resistive sensor and the ferrite may be assembled with a flip chip technique.

Such a flip chip technique allows a fast and cost effective assembly of the sensor and the ferrite, so that the manufacturing process of the sensor package may be optimised.

According to an exemplary embodiment of the invention, a method for manufacturing a sensor package comprises bending a lead frame so as to achieve a first portion extending in a direction along a first longitudinal axis and having a die pad, and a second portion extending in a direction inclined to the longitudinal axis, which second portion has a first side facing away from the first portion and a second side opposing to the first side, mounting an application specific integrated circuit onto the die pad, and mounting a magneto resistive sensor and a ferrite to the second portion, electrically connecting the magneto resistive sensor to the application specific integrated circuit, and moulding in a single moulding step a body covering the second portion of the lead frame, the magneto resistive sensor, the ferrite, the die pad, the application specific integrated circuit and an electrical connection between the sensor and the application specific integrated circuit, so as to achieve a one-piece moulding body.

By replacing a first moulded portion, including for example the magneto resistive sensor, and a second moulded portion, including for example the application specific integrated circuit, by a single encapsulation of a one-piece moulding body on both, the sensor and the application specific integrated circuit, the total outer dimension of the sensor package may be reduced in size, and allowing at the same time to provide the customer with an exact orientation of the magneto resistive sensor and the ferrite to each other, as well as a protected electrical connection between the elements. Further, it is possible to also overmould the ferrite by this one-piece moulding body to further improve the application of the inventive sensor package.

According to an exemplary embodiment of the invention, the lead frame is formed as a plurality of fingers in the transit from the first portion to the second portion, wherein at least a part of the fingers may be electrically isolated from the die pad, which fingers may be connected to a tie bar for positioning purposes before mounting. This tie bar is removed after mounting one element out of the group consisting of the magneto resistive sensor and the ferrite to the fingers, thus fixing a finger position.

By the tie bar, the position of the fingers may be pre-determined during the manufacturing, and at the same time the fingers may be kept isolated from the die pad. After mounting the sensor or the ferrite to the fingers, the tie bar may be removed since the sensor or the ferrite overtakes the function of the tie bar with respect to the task of positioning of the fingers. When removing the tie bar, the electrical connection by the bar between the plurality of the fingers may be interrupted, so that the plurality of fingers may be used as a plurality of electrical separated conductors between the sensor and the application specific integrated circuit mounted onto the die pad.

According to an exemplary embodiment of the invention, the ferrite is provided on at least one side with a die attached foil or wafer back laminate adhesive coating.

It should be noted that the ferrite also may be provided on both sides with such a foil or adhesive coating, which simplifies the mounting process of the ferrite.

It should be noted that a further improvement of the attaching may be achieved by the one-piece moulding body, so that the attach foil or adhesive coating is supported by the moulding body for stabilizing purposes in the ready made sensor package.

According to an exemplary embodiment of the invention, the method comprises sub-mounting the ferrite and the magneto resistive sensor together to form a sub-assembly, and mounting the sub-assembly onto the second portion of the sensor package.

It should be noted that the sub-mounting of the ferrite and the magneto resistive sensor may be useful with respect to the exactness of the position and orientation of the sensor and the ferrite to each other, so that, for example, this sub-mounting may be carried out on different manufacturing machines, which are adapted to provide a sufficient exact manufacturing process for the sub-assembly of the magneto resistive sensor and the ferrite.

According to an exemplary embodiment of the invention, the ferrite is mounted onto the second portion prior to the mounting of the magneto resistive sensor. Thus, the ferrite may act as a positioning element of the fingers being electrically isolated to the die pad, and at the same time serving as a substrate for the magneto resistive sensor.

According to an exemplary embodiment of the invention, the bending of the lead frame is carried out before assembling of the sensor package, i.e. the lead frame is bent before mounting the application specific integrated circuit, the ferrite and the magneto resistive sensor to or onto the lead frame.

This, in particular, reduces the risk of damaging the electrical components during a bending process, since the electrical components are mounted afterwards.

According to an exemplary embodiment of the invention, a programme element is provided which, when being executed on a processor, is adapted to carry out the inventive method.

According to an exemplary embodiment of the invention, a computer readable medium is provided, having stored thereon the inventive programme element.

It may be seen as a gist of the present invention to provide a sensor package, having an increased vertical integration of manufacturing, and at the same time an improved quality with respect to the tolerances of the position and orientation of the different relevant elements of a sensor package.

These and other aspects of the present invention will become apparent from and elucidated with reference to the embodiments described hereinafter.

BRIEF DESCRIPTION OF THE DRAWINGS

Exemplary embodiments of the present invention will be described in the following with reference to the following drawings.

DETAILED DESCRIPTION OF EXEMPLARY EMBODIMENTS

Figure 1:
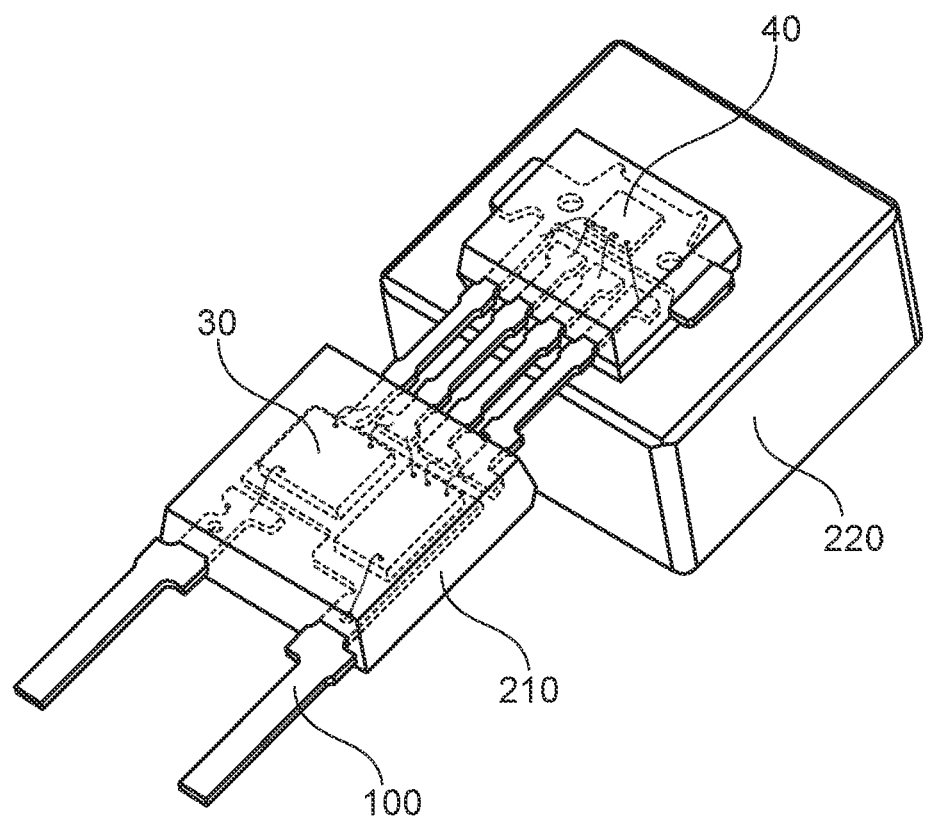
FIG. 1 shows a sensor package in which the sensor and the electronic components are accommodated in different moulded bodies.
Figure 2:
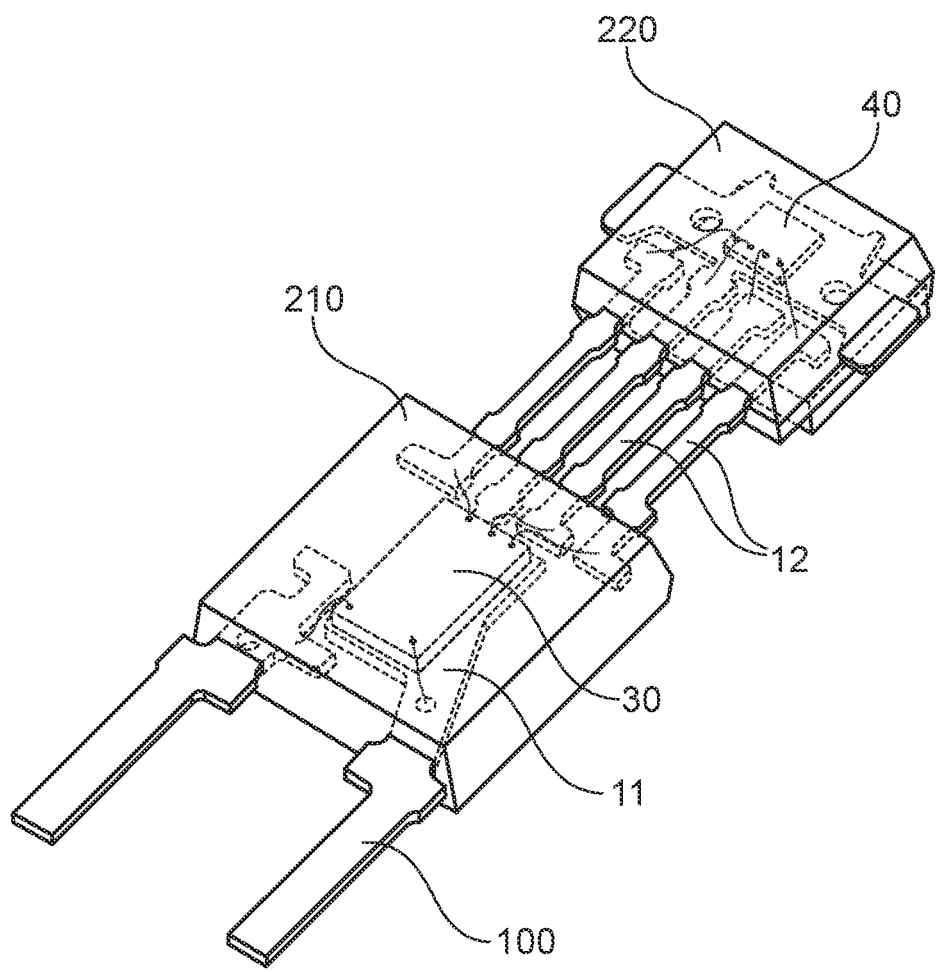
FIG. 2 shows another sensor package, in which the sensor and the electronic components are accommodated in separate moulding bodies.

FIG. 1 shows a sensor package in which the sensor 40 and electronic components as, for example, application specific integrated circuits 30 are provided in different moulding bodies 210, 220. FIG. 2 shows another sensor package in which the sensor 40 and the electronic components like, for example, an application specific integrated circuit 30, are provided in different moulding bodies 210, 220, wherein the moulding bodies are connected by a plurality of fingers 12.

In FIGS. 1 and 2, the electronic components like, for example, an application specific integration circuit 30 are provided in a second moulding body or moulded portion 220, wherein the sensor 40 is provided in a first moulding body or a first moulded portion 210. Such sensor packages may, for example, include a magneto resistive sensor and an application specific integrated circuit for automotive applications (see, for example, SOT453). Such a package comprises, for example, a first 210 and second 220 moulded portion, and adjacent to the first moulded portion 210 a ferrite (not shown). A customer may, if desired, bring the sensor 40 into the required orientation by bending the leads in form of, for example, fingers 12 extending between the first moulded portion 210 and second 220 moulded portion.

However, such a package may have a disadvantage, namely, that after bending the product may have to be over moulded so as to keep the correct orientation of the sensor 40. Problems may occur herein, since the volume to be moulded is larger on one side of the second portion 220 (with, for example, the application specific integrated circuit 30) than on the other opposite side of this portion. This may occur due to the L-shape in cross section of the product after bending.

Figure 3:
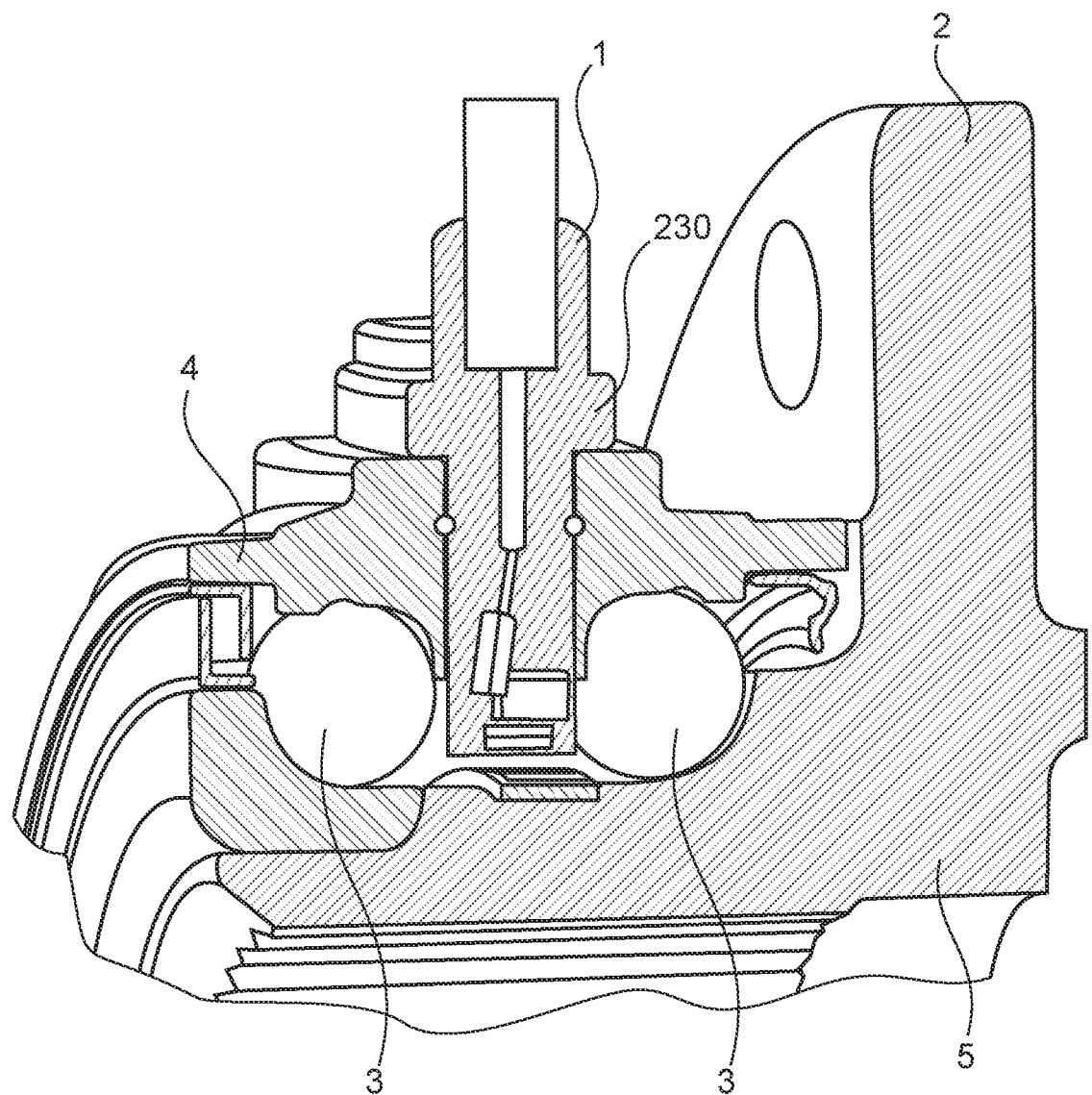
FIG. 3 shows the position of a sensor package close to a wheel bearing.

FIG. 3 shows the implementation of a sensor package 1 into a wheel 2 close to a bearing 3 between the stator 4 and the rotor 5 of the wheel.

The customer even has to modify the shape of the overmould 230 in FIG. 3, so as to reduce mould flow problems, which may give rise to die crack and yield loss.

Figure 4:
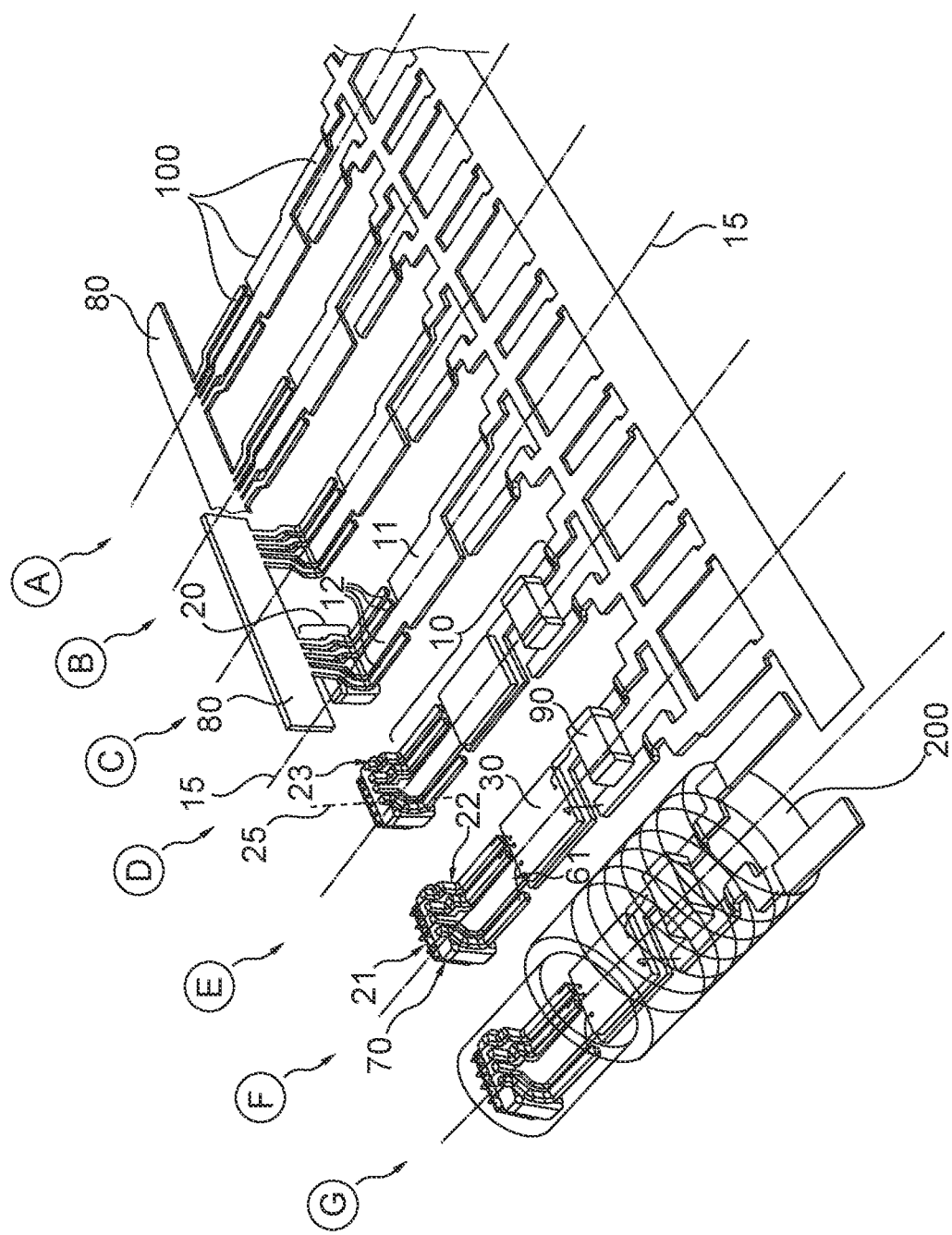
FIG. 4 shows sensor packages, according to the present invention, in different manufacturing steps.

FIG. 4 shows sensor packages, according to the present invention, in different manufacturing steps. The sensor package comprises a lead frame 100, which lead frame comprises a first portion 10 and a second portion 20. The first portion 10 comprises a die pad 11. The first portion 10 extends into a longitudinal axis 15, wherein the second portion 20 extends into a direction 25 being inclined to the longitudinal axis 15. Further, there is provided a plurality of fingers 12, which are electrically isolated over the die pad 11 in order to use the fingers as electrical connections between, for example, the sensor 40 and the application specific integrated circuit 30, which circuit is mounted on to the die pad 11. During the manufacturing, the fingers may be fixed by a tie bar 80. In the first two positions A and B the tie bar is in the same plane like the remaining parts of the lead frame 100. In the positions C and D, the second portion of the lead frame 100 is inclined over the first part 10 of the lead frame 100, wherein the tie bar 80 in this case is connected to the second portion of the lead frame 100. In this embodiment, the inclination is perpendicular. The second portion 20 may consist, for example, out of a plurality of fingers, which also may extend into the first portion 10 of the lead frame 100. At least some of the fingers are isolated over the die pad 11, so that the plurality of fingers 12 may be used as electrical connections between the sensor and an application specific integrated circuit 30. Then, one out of a group consisting of the ferrite and the magneto resistive element is mounted to the second portion 20, as can been seen on position D, so that the mounted element acts as a fixing element for the fingers, which are electrically isolated from the die pad 11. After the mounting of the fixing element, the tie bar 80 may be removed, since the mounted fixing element overtakes the function of the tie bar as the element responsible for fixing the position of the plurality of fingers 12. In a further sensor package like in position E, the application specific integrated circuit 30 is mounted onto the die pad 11 of the lead frame 100, and, for example, wire bonds 61 may be applied to connect the fingers with the application specific integrated circuit 30. The sensor may be mounted on to a first side 21 of the second portion 20, which first side 21 is facing away from the first portion 10 of the lead frame 100.

The sensor 40 and the ferrite 50 may be pre-assembled as a separate component 70 which may be mounted on the first side 21 of the second portion 20, as can be seen on position F. As a further component, a capacitor 90 may be mounted onto the lead frame 100. After the mounting, the sensor package will be provided with a one-pieced moulding body 200, as can be seen on position G. This one-piece moulding body may cover the lead-frame and all the components being mounted thereon.

Thus, the sensor package as depicted on position G in FIG. 4 comprises a single encapsulation for both the magneto resistive sensor 40 and the application specific integrated circuit 30. Also the ferrite 50 may be overmoulded in this encapsulation in form of a one-pieced moulded body 200. The lead frame 100 is bent prior to the encapsulation, and may also be bent prior to the mounting of the elements. However, if an appropriate bending process is available, the bending may be also carried out after the mounting of the electronic components.

As can be seen from FIG. 4, the lead frame 100 has a first die pad 11 for the application specific integrated circuit 30, and a second area in form of a mounting portion 23 for the sensor. In this embodiment, the fingers 12 extend between the die pad 11 and the mounting portion 23. In the present embodiment, three of the fingers are isolated, i.e. free standing and not connected to one of the die pads 11. However also any other number of isolated fingers may be provided. The frame may be held together prior to encapsulation by a tie bar 80, which also may be located between the die pad 11 and the mounting portion 23. It should be noted that this embodiment is not shown in the drawings.

However, also, an alternative design of the lead frame may be used, as it is depicted in FIG. 4. The alternative lead frame design comprises the die pad 11 for the application specific integrated circuit 30, but not an explicit die pad for the sensor. Moreover, the fingers extend to the area intended for the assembly of the sensor 23. At the ultimate portion thereof, i.e. at the side of the sensor area remote from the die pad 11, a tie bar may be connected, so as to keep the fingers together prior to encapsulation like in FIG. 4, position A, B, C and D.

The present invention also allows to reduce the size of the ferrite, wherein the magnetic field at the sensor should be equal, but the distance between the sensor and ferrite may be reduced due to the integration of the ferrite. As an alternative, another less strong ferrite could be chosen, where it is appropriate, since a smaller ferrite also reduces the product size.

Since there is now one encapsulated product, there is no need anymore for an additional over moulding of the complete product by a customer. Instead, a partial over moulding suffices for further product integration.

Further, the product performance increases because of the bending with the provision of the required orientation, which bending may be carried out much more precisely during the manufacturing process at the site of the manufacturer of the sensor package. Thus, also the product reliability improves because bending during the last step of the over moulding turns out to give rise to rejects.

Further, no punching of the lead frame portion between the first and second moulded portion is needed anymore. Also such punching could give rise to strength reduction of the product, so that the present invention also allows to provide a product having an increased strength of the structure.

It should be noted that the bending may be also carried out at any time prior to encapsulation.

According to one embodiment, it is considered to do the bending prior to assembly, so as to prevent mechanical stresses to the electronic components. It should be noted that the assembly and the wire bonding may also be provided in two different orientations.

Figure 5:
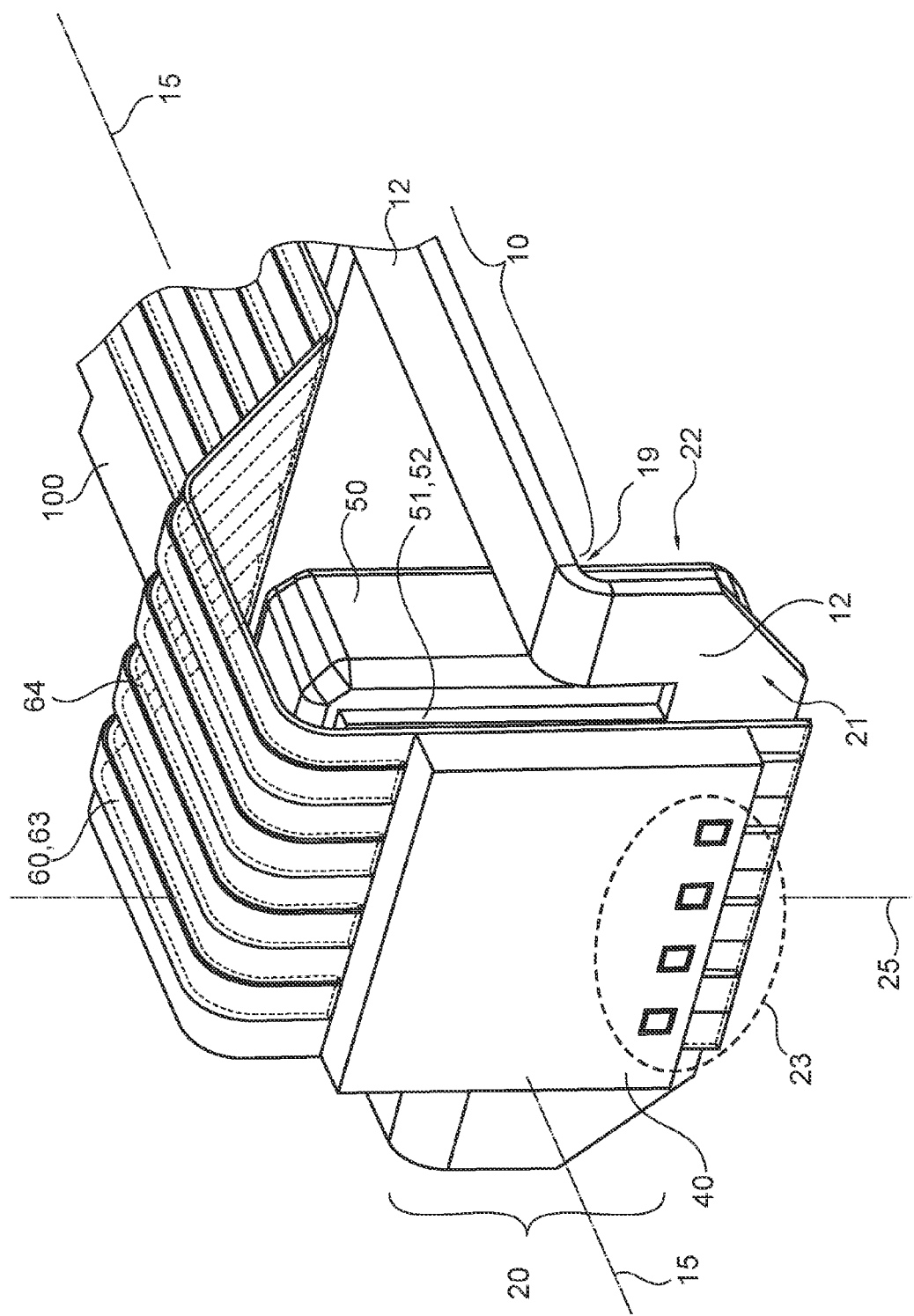
FIG. 5 shows an embodiment of a sensor package according to the present invention.

FIG. 5 shows a further exemplary embodiment of the invention, where the sensor 40 is attached to the first side 21 of the second portion 20 of the lead frame 100.

The ferrite 50 is provided on the second side 22 of the second portion 20, i.e. on the opposing side of the sensor. The ferrite may be provided with a die attached foil 51 or wafer back laminate adhesive coating 52. This provides a good solution for attachment of the ferrite to the discreet fingers. Further, the ferrite may be provided at both sides with such a die attached foil or wafer back laminate, which enables that the assembly of the ferrite can be done side-independent, i.e. normal and upside down are now equal.

By coupling the sensor to the fingers with wire bonds, the wires are less sensitive to stress present as a consequence of bending, also in case of pre-bended fingers. With a bonding to a remote location, the bonding area in the fingers may be completely planar, which may be not certain at a side near to a bent portion.

With respect to FIG. 4, the ferrite 50 and the sensor 40 may be assembled together first to form a sub-assembly 70. This is achieved with some kind of carrier such as TULIP or UTLP (universal thin lead frame package) to provide an SMD mountable interface to the sub-assembly.

With respect to FIG. 5, the use may be made of flexible foils or a flexible foil structure 63 having leads 64 implemented, in addition to a bend carrier. By this, the mechanical and electrical interface of the aforementioned sub-assembly 70 are separated, enabling a more robust design. The mechanical interfaces may be proved by an SMD mountable interface, wherein the electrical connection between the magneto resistive element and the application specific integrated circuit may be provided with a flexible foil, as can be seen in FIG. 5.

If the ferrite 50 is positioned on the side of the fingers opposite to the side on which the sensor is assembled, as it is depicted in FIG. 5, the sensor 40 may be assembled with a flip chip technique instead of wire bonds. This reduces the overall resistance of the path between the sensor 40 and the application specific integrated circuit 30, and may thus contribute to a better signal to noise ratio of the sensor output.

Figure 6:
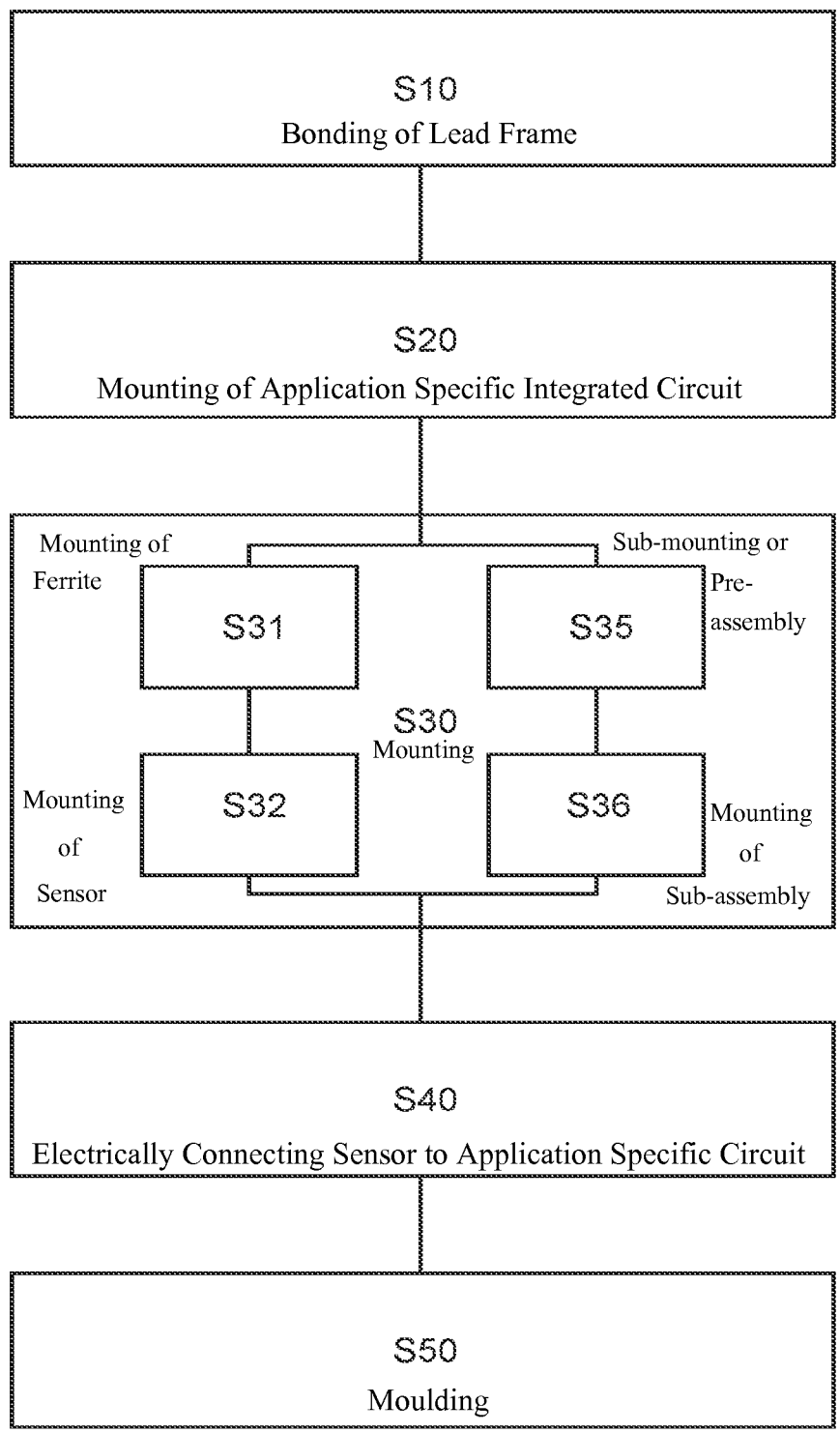
FIG. 6 shows a flow chart of an exemplary embodiment of the inventive method.

FIG. 6 illustrates a flow chart of an exemplary embodiment of the inventive method. The manufacturing process can also be seen from the different positions in FIG. 4. The method includes bending S10 of a lead frame 100 so as to achieve a first portion 10 extending in a direction along a first longitudinal axis 15 and having a die pad 11, and a second portion 20 extending in a direction 25 inclined to the longitudinal axis, which second portion 20 has a first side 21 facing away from the first portion and a second side 22 opposing to the first side. The mounting step S20 includes mounting of an application specific integrated circuit 30 on to the die pad, and the mounting S30 includes mounting of a magneto resistive sensor 40 and a ferrite 50 on to the second portion. The mounting S30 of a magneto resistive sensor 40 and a ferrite 50 on to the second portion may be carried out as mounting the ferrite 50 to the second portion S31 prior to the mounting S32 of the magneto resistive sensor 40. As an alternative, the ferrite and the magneto resistive sensor may be sub-mounted or pre-assembled S35 together to form a sub-assembly 70 prior to the mounting S36 of the sub-assembly to the second portion of the sensor package.

In S40, the magneto resistive sensor is electrically connected to the application specific integrated circuit, and in S50, a body 200 is moulded in a single moulding step to cover the second portion of the lead frame, the magneto resistive sensor, the ferrite, the die pad, the application specific integrated circuit and an electrical connection 60 between the sensor and the application specific integrated circuit so as to achieve a one-piece moulding body.

It should be noted, that the main method sections S10, S20, S30 and S40 may also be changed in sequence or carried out in parallel, where it is appropriate. The moulding S50 however, can be carried out only after having finished S10, S20, S30 and S40, since after moulding, further modifications are not possible without any effort.

The present invention may be applied to the manufacturing of semi-conductors, in particular, for sensors for automotive application. However, the present invention may also be applied to any other sensor application, where it is desired to obtain the advantages provided by the present invention.

It should be noted that the term 'comprising' does not exclude other elements or steps and the 'a' or 'an' does not exclude a plurality. Also elements described in association with the different embodiments may be combined.

It should be noted that the reference signs in claims should not be construed as limiting the scope of the claims.

The invention claimed is:

1. A sensor package comprising:
   a lead frame having a first portion extending in a direction along a first longitudinal axis, and a second portion extending in a direction inclined to the first longitudinal axis, wherein the first portion includes a die pad;
   an application specific integrated circuit, which is mounted to the die pad;
   a magneto resistive sensor and a ferrite, which are mounted to the second portion, wherein the ferrite is mounted directly on the second portion and the magneto resistive sensor is mounted on top of the ferrite in a direction that is substantially perpendicular to the first longitudinal axis;
   a plurality of fingers made of conducting material for providing an electrical connection between the magneto resistive sensor and the application specific integrated circuit, the plurality of fingers are electrically isolated from the die pad;
   a moulding body including a first moulding portion and a second moulding portion, the first moulding portion covering the second portion of the lead frame, the magneto resistive sensor, the ferrite, and the second moulding portion covering the die pad, the application specific integrated circuit, wherein the moulding body is a moulded one-piece body.

2. Sensor package of claim 1, wherein the plurality of fingers extend to a mounting area of at least one of the group consisting of the magneto resistive sensor and the ferrite, wherein the second portion of the lead frame is configured and arranged to provide mechanical orientation of the magneto resistive sensor, wherein the mechanical orientation includes bending.

3. Sensor package of claim 1, further including wire bonds to connect the plurality of fingers with electrical connection to the application specific integrated circuit.

4. Sensor package of claim 1, wherein the magneto resistive sensor is electrically coupled to the plurality of fingers with wire bonds that are attached to the plurality of fingers at a side remote from the application specified integrated circuit.

5. Sensor package of claim 1, wherein the magneto resistive sensor and the ferrite are submounted as a separate component.

6. Sensor package of claim 1, wherein the magneto resistive sensor and the ferrite are configured and arranged for flip-chip assembly.

* * * * *